United States Patent [19]

Diehl-Nagle et al.

[11] Patent Number: 4,805,148
[45] Date of Patent: Feb. 14, 1989

[54] HIGH IMPENDANCE-COUPLED CMOS SRAM FOR IMPROVED SINGLE EVENT IMMUNITY

[76] Inventors: Sherra E. Diehl-Nagle, 1004 Demericus St., Durham, N.C. 27701; John R. Hauser, 6800 Phillip Ct., Raleigh, N.C. 27607

[21] Appl. No.: 800,990

[22] Filed: Nov. 22, 1985

[51] Int. Cl.$^4$ .................. G11C 11/00; G11C 7/00
[52] U.S. Cl. .................... 365/154; 365/190; 365/156; 357/23.6
[58] Field of Search .............. 365/156, 154, 190, 189, 365/205, 207, 208; 357/23.6, 42

[56] References Cited

U.S. PATENT DOCUMENTS

| | | | |
|---|---|---|---|
| 3,493,786 | 3/1970 | Ahrons et al. | 307/450 X |
| 4,023,148 | 5/1977 | Heuber et al. | 365/156 |
| 4,095,281 | 6/1978 | Denes | 365/189 X |
| 4,130,892 | 12/1978 | Gunckel, II et al. | 365/154 X |
| 4,132,904 | 1/1979 | Harari | 365/156 X |
| 4,175,290 | 11/1979 | Harari | 307/238 X |
| 4,403,306 | 9/1983 | Tokushige et al. | 365/156 X |
| 4,418,402 | 11/1983 | Heagerty et al. | 365/156 X |
| 4,463,273 | 7/1984 | Dingwall | 365/156 |
| 4,506,349 | 3/1985 | Mazin et al. | 365/189 |
| 4,507,759 | 3/1985 | Yasui et al. | 365/189 |
| 4,575,821 | 3/1986 | Eden et al. | 365/154 X |

FOREIGN PATENT DOCUMENTS

| | | | |
|---|---|---|---|
| 0045403 | 2/1982 | European Pat. Off. | |
| 3006442 | 9/1980 | Fed. Rep. of Germany | 365/156 |
| 57-152591 | 9/1982 | Japan | 365/154 |
| 60-224195 | 8/1985 | Japan | 365/156 |

*Primary Examiner*—Stuart N. Hecker
*Assistant Examiner*—Alfonso Garcia
*Attorney, Agent, or Firm*—Bell, Seltzer, Park & Gibson

[57] ABSTRACT

A CMOS SRAM exhibiting a high level of immunity to single event upset errors, such as caused by ionizing radiation, is disclosed. In CMOS SRAM cells with small feature sizes, single event errors result from ion interactions with transistor drains on the side of a cell holding a low voltage. The configuration of the cell presents a high impedance between these low voltage drains and the low voltage gate on the opposite side of the cell, while presenting a high impedance between corresponding components with high voltages. The SRAM cell is protected from single event errors while minimizing the increase in switching speed which accompanies any increase in internal cell impedance.

11 Claims, 3 Drawing Sheets

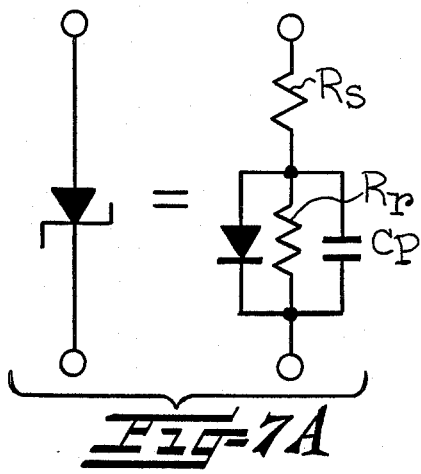
FIG-7A
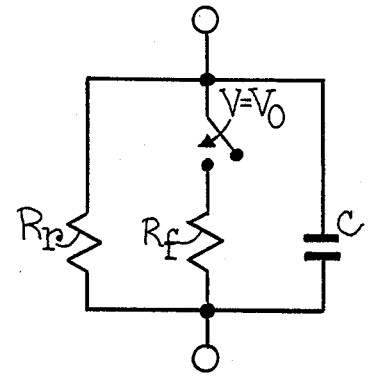
FIG-7B
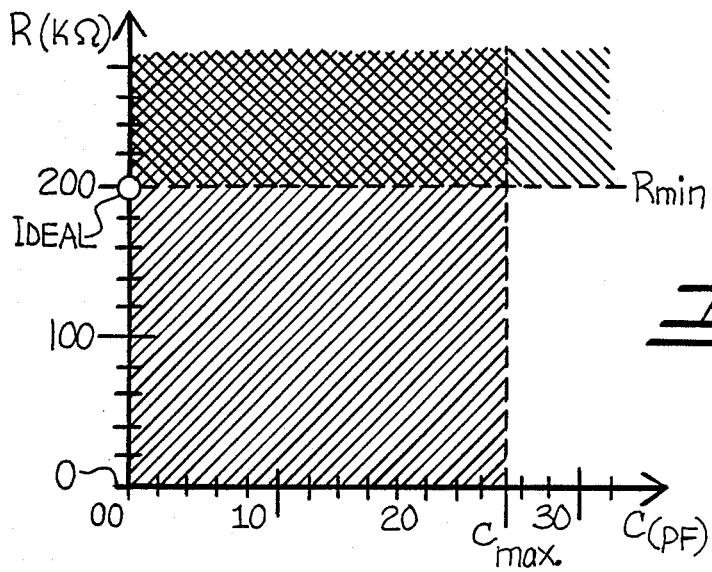
FIG-8
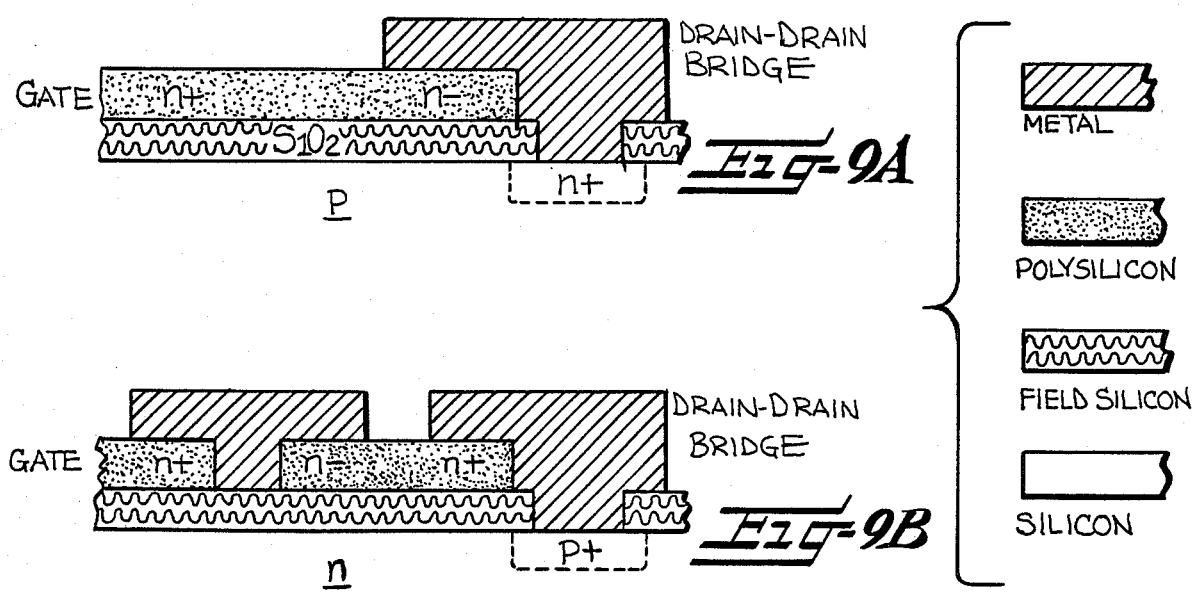
FIG-9A
FIG-9B

HIGH IMPENDANCE-COUPLED CMOS SRAM FOR IMPROVED SINGLE EVENT IMMUNITY

This invention was made with government support under N00014-84K-2003 awarded by DNA/DARPA Single Events Program.

FIELD OF THE INVENTION

This invention relates generally to the radiation hardening of electronic devices and more particularly to increasing the immunity of complementary metal oxide semiconductor (CMOS) static random access memory (SRAM) chips from single upset errors caused by incident radiation.

BACKGROUND OF THE INVENTION

Semiconductor devices (such as transistors) are used in computer memories and other related applications to maintain for a certain period of time a specified electrical state (i.e. a certain charge or voltage level) such as that representing a logical "0" or a logical "1" in a binary data processing system. The integrity and accuracy of the data (or instructions) stored in the computer memory, any calculations or data processing based thereon, and even the ability of the computer to operate as intended, are all directly related to the capability of the semiconductor device to maintain its designated state for the desired period of time with no change.

Radiation has an adverse effect on semiconductor devices and integrated circuits, and can seriously degrade performance, including the ability to maintain the designated state for the desired period of time. The radiation may occur naturally following the emission of cosmic rays or as a result of the natural radioactive decay of uranium or thorium or other high alpha energy emitters, or as the result of a nuclear event. When the radiation strikes a sensitive area of a semiconductor device, such as a p-n junction or the drain on the side of a SRAM cell holding a low voltage, it may induce a current flow or a voltage differential sufficient to cause the device to improperly change state. Such unintended changes of state are referred to as single event upset errors or soft errors.

This problem is exacerbated because the errors can appear as an intended signal or change of state of individual transistors within the memory cell without causing any damage or otherwise reflecting that the change was unintended. Thus, the state of the memory cell is erroneously changed, and upon testing the device will appear to be free form defects, so that the cause of the error will most likely go undiscovered. Moreover, the sensitivity of semiconductor devices to radiation increases as integrated circuit dimensions decrease and device density increases because more of the environmental radiation sources are capable of delivering charge amounts exceeding those representing information.

In the past, various techniques have been developed to enhance the immunity of a SRAM to unwanted changes in state induced by ionizing radiation. This has included innerting a resistor or resistor-capacitor network between the stages of the memory cell. However, this necessitates an increase in the write cycle time, which degrades the performance of the memory, and unduly increases the elements comprising the memory cell and the processing steps needed during fabrication, which increases device size, cost and complexity while reducing device yields and manufacturing efficiencies.

Thus, it is an object of the present invention to provide a memory cell having a high immunity to ionizing radiation by reducing the sensitivity of a semiconductor device to single event upset errors arising from incident radiation, such as stray ions, cosmic radiation, radioactive decay, or other alpha energy emissions.

It is another object of the present invention to provide a memory cell having a high immunity to ionizing radiation without degrading write-cycle times or increasing processing steps.

It is a further object of the present invention to provide a memory cell which is radiation-hardened and which maintains favorable write cycle times over the temperature range from $-55°$ to $+125°$ C.

These and other objects are accomplished by generally providing a static random access memory cell with a diode in series with the gates of the cross-coupled inverter pair which comprises the SRAM cell. In CMOS SRAM cells with relatively small feature size, single event upset errors result from ion interactions with the two transistor drains of the cell holding a low voltage. The diode of the present invention presents a high impedance between these low voltage drains and the opposite gate to isolate them and prevent a change of state to a high voltage. On the other hand, a low impedance is presented between the corresponding components holding a high voltage. Thus, the diode passes forward currents when a change of state is desired and blocks currents resulting from a radiation ion hitting a sensitive low voltage gate, to effectively protect against the harmful and undesired change of state.

More specifically, the radiation hardened SRAM cell of the present invention comprises first and second inverter stages, with each of the stages including a conduction path and a control path. The conduction path of each inverter stage includes a data node and the control path of each inverter stage is electrically connected to the data node of the other inverter stage. Means for controlling the current flow between each data node and the conduction path pass substantially only forward currents between the control path and the data node susceptible to single event destabilizations to prevent reverse currents changing the state of the data node.

BRIEF DESCRIPTION OF THE DRAWINGS

FIGS. 7A–B is a schematic diagram representing a circuit-equivalent feedback diode.

FIG. 8 is a characterization showing the ideal resistive and capacitive properties required to protect an SA3240 cell against 4pc of collected charge.

FIGS. 9A–B is a schematic diagram of Schottky-like diode implementations for fabrication of feedback elements shown in FIGS. 5A–5C and 6A and 6C.

DETAILED DESCRIPTION OF THE ILLUSTRATED EMBODIMENT

Figure 1:
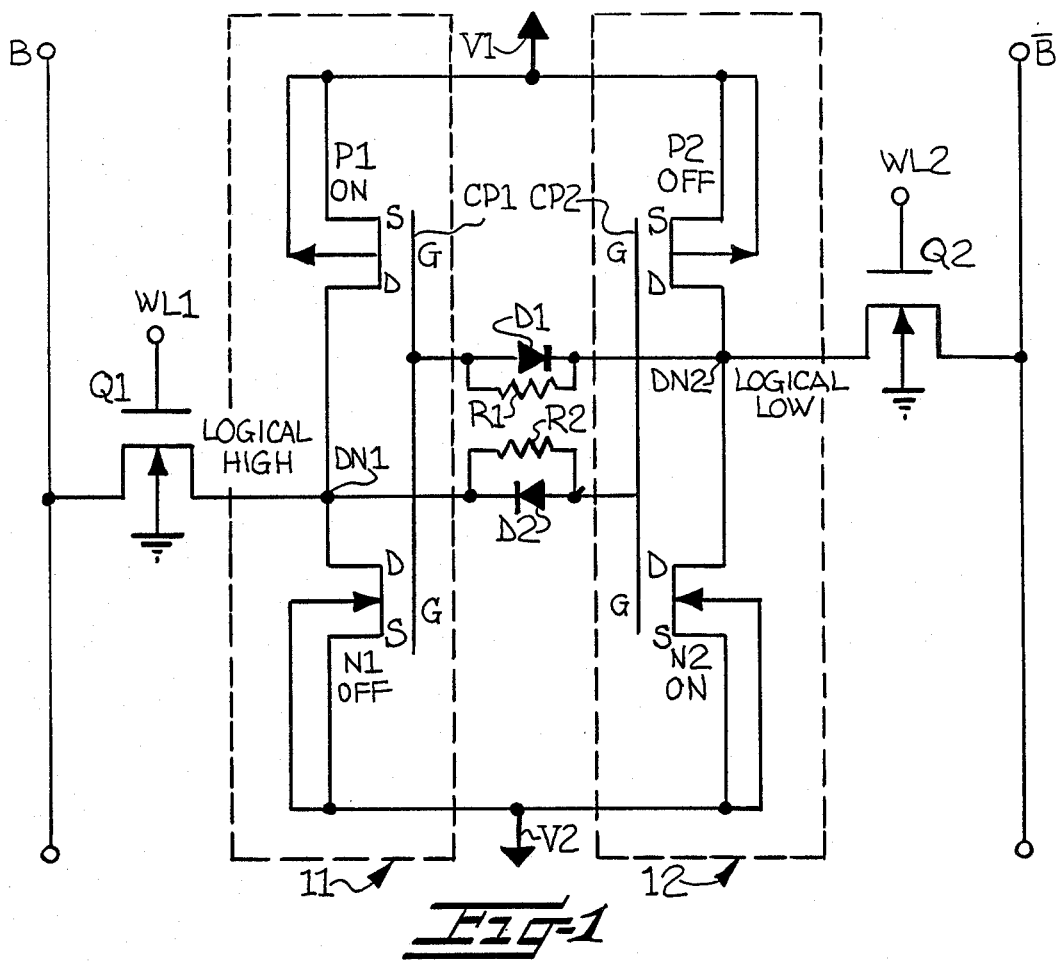
FIG. 1 is a schematic diagram of a 6 transistor p-well CMOS SRAM cell of the present invention in a stable state.

While the present invention will be described more fully hereinafter with reference to the accompanying drawings, in which a particular embodiment is shown, it is to be understood at the outset that persons skilled in the art may modify the invention herein described while still achieving the favorable results of this invention. Accordingly, the description which follows is to be understood as a broad teaching disclosure directed to persons of skill in the appropriate arts, and not as limiting upon the present invention.

The improved CMOS SRAM of FIG. 1 comprises first and second inverters 11, 12, with series diodes D1, D2 electrically connected to pass only forward currents from the control path CP1, CP2 of one inverter to the respective data node DN2, DN1 of the other inverter, as described in more detail below.

Inverter stage 11 includes an n-type N1 and a p-type P2 complementary metal oxide semiconductor (CMOS) field effect transistor (FET). Each of the transistors comprises a source S, a gate G and a drain D as illustrated. For transistor P1 the source S is connected to voltage source V1, the drain D is connected to control path CP1, and the drain D is connected to data node DN1. For transistor N1 the source S is connected to voltage source V2, the drain D is connected to the same data node DN1, and the gate G is connected to the same control path CP1 as is the gate G of transistor P1. The current path from V1 through the source and drain of transistor P1, the data node DN1, and the corresponding drain and source of transistor N1 to V2 is defined as the conduction path for inverter 11. Inverter 12 is identical to inverter 11 and comprises an n-type N2 and p-type P2 CMOS FET. The source S of transistor P2 is connected to voltage source V1, and the respective drain D is connected to data node DN2. The source S of transistor N2 is connected to voltage source V2, and the respective drain D is connected to the same data node DN2. The gates G of both transistors P2, N2 are connected to control path CP2. The current path from V1 through transistors P2, N2 to V2 is the conduction path for inverter 12.

Inverters 11, 12 are cross coupled by connecting the anode of diode D1 to the control path CP1 of inverter 11 and the cathode of diode D1 to the data node DN2 of inverter 12. Similarly, the anode of diode D2 is connected to the control path CP2 of inverter 12, and the cathode of diode D2 is connected to the data node DN1 of inverter 11. These diodes pass substantially only forward currents form the control path of one inverter to the data node of the opposite convertor, and block reverse currents. The resistors R1, R2 across each of the respective diodes D1, D2 represent the reverse biased junction leakage currents.

In the context of a complete array of static random access memories, the standard memory cell of cross coupled inverters 11, 12 is interconnected with data bit bus lines B and $\overline{B}$ via transistor switches Q1, Q2. Transistor Q1 electrically connects bus line B to data node DN1 in response to a signal on write line WL1, and transistor Q2 electrically connects bus line $\overline{B}$ to data node DN2 in response to a signal on write line WL2.

The write lines WL1, WL2 are connected to row select lines, not shown.

Figure 2:
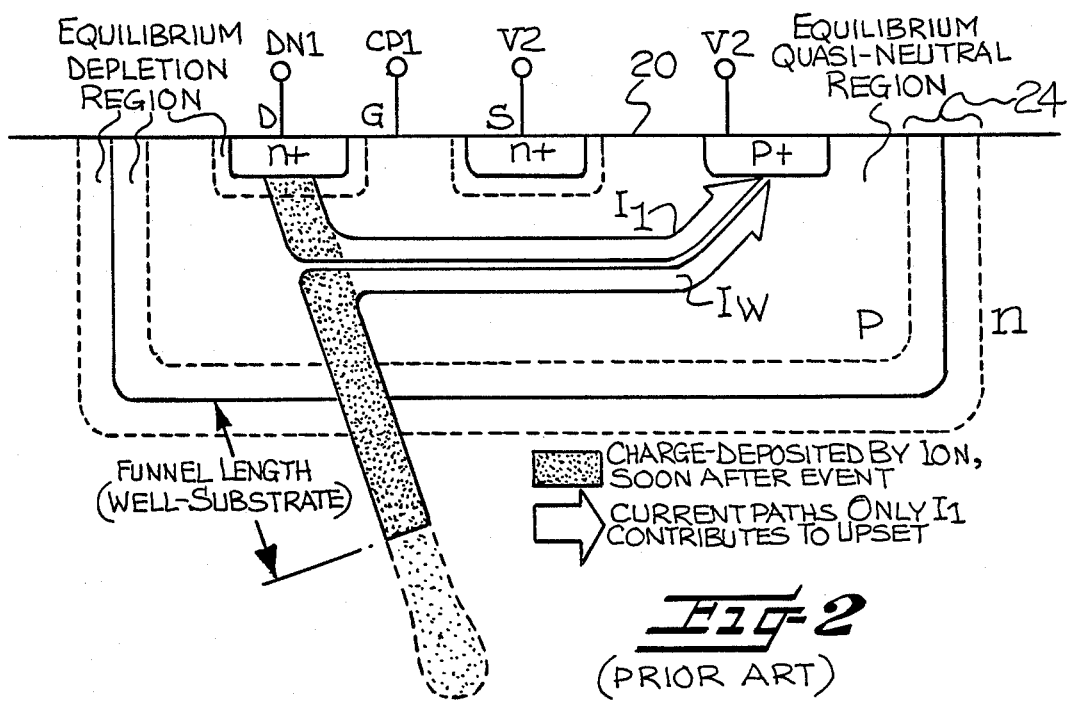
FIG. 2 is a schematic representation of the partitioning of track charges between drain and substrate junctions of prior art off transistors-in-wells following a single event upset.

The standard six-transistor static RAM cell described above is shown in one of its stable states in FIG. 1 with data node DN1 at a logical high voltage and data node DN2 at a logical low voltage. Thus, this cell can be destabilized by events which unintentionally lower the voltage of data node DN1, or raise the voltage of data node DN2. This includes single-event interactions which effect the drains of transistors N1 and P2, which are off. For instance, the collection of charge produced by a single event may generate a current pulse or ion shunt which can perturb the node voltages (lowering the voltage of n+p junctions and raising that of p+n junctions) of transistors for epitaxial CMOS technologies. For the circuit in FIG. 1, the drain of P1 is vulnerable in n-well epitaxial ("epi") technologies, and the drain of N2 is vulnerable in p-well epi technologies. CMOS transistors are generally fabricated in "wells". A well is a diffused region of a semiconductor type opposite the type of the epitaxial layer in which the transistor is fabricated. The purpose of a well is to minimize leakage between adjacent transistors by electrically isolating them from one another. Such a well is illustrated in FIG. 2 as the p-type region 20 surrounding the structures diffused into the upper surface of the n-type epitaxial layer. Thus, electrons will be the majority carrier in an n-well and holes will be the majority carrier in a p-well. At most, three transistors are vulnerable to single event interactions. Single event interactions with an "on" transistor which is not in a well will generate currents which usually reinforce the logic state. At present, it is not experimentally confirmed that epi-SRAMs can be upset by hits to on transistors-in-wells. However, the design concepts presented here are effective whether or not those transistors are vulnerable.

Considering only charge collection from single event tracks penetrating the drains of "off" transistors, and the magnitudes of charges collected, the magnitudes of collected charge required for cell upset can be differentiated for the p-channel and n-channel "off" transistors. The critical charge relationships of p-channel and n-channel transistors depend on their relative speed (determined in part by carrier mobility, and hence the type of well used); the charge collection capabilities of p-channel and n-channel transistors also depend on which is in the well. In the following discussion, the p-well technology is discussed. The arguments for the n-well technology are fully analogous.

One characteristic upon which the present design is based is that CMOS SRAMs can be designed so that the "off" transistors-in-wells cannot collect sufficient charge to change state to "on" from a single event upset. The charge collected from an ion track is less than or equal to the charge deposited within the funnel length of a hit data node. If the ion track penetrates more than one junction, competing junctions can partition the collected charge. A reasonable approximation of the partitioning of collected charge by competing reverse-biased junctions is obtained by assuming that a junction will collect all of the charge deposited in its equilibrium depletion region and that the charge deposited within equilibrium quasi-neutral regions will be equally divided by bordering junctions whenever separation between junctions is less than the sum of the funnel lengths of the junctions. An example of the partitioning of charge between an off n-channel drain (such as N1) and a p-well-to-substrate junction is diagrammed as FIG. 2. Depicted therein is a schematic cross-section of a CMOS transistor showing the earlier mentioned source S, gate G and drain D structures diffused into a p-type well 20. Also diffused into the well is a p+ type contact which a resistance reducing contact. In the operation of the device, the p+ contact is connected to the low voltage potential (in this case V2 as shown in FIG. 1). A single event can deliver charge and when it strikes a sensitive node of a transistor, the energy of the particle is depleted through the generation of electron-hole pairs along the length of its track as shown by the stippled region in FIG. 2.

Figure 3:
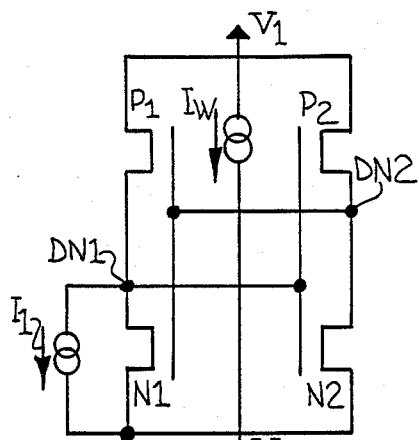
FIG. 3 is a schematic diagram representing the currents arising from a single event upset penetrating the prior art off transistor-in-well of FIG. 2.

The electrons and holes tend to become segregated and follow separate current paths. The possible paths which the current caused by a single event can take after hitting a sensitive node are shown as $I_l$ and $I_w$ in FIG. 2. In the illustrated transistor, node DN1 holds a logical "high" voltage. Therefore, only the current path $I_l$ (containing the electrons) between node DN1 and the p+ contact is capable of destabilizing the cell by raising the voltage present at node DN1 to a logical "high" through a current flow from the diode node DN1 (n+ region) to the p+ contact (V2), as was the problem with the prior art. The present invention, in contrast, successfully prevents the current $I_l$, from reaching the p+ contact. FIG. 3 shows the circuit effects of the currents represented in FIG. 2. Only the current $I_l$ between data node DN1 and voltage source V2 across the drain and source of transistor N1 can upset the cell. (Single events cannot generate $I_w$ or hole currents directly between the voltage sources V1 and V2 large enough to affect the voltage supply to the RAM cell appreciably. The term RAM cell is used to generally describe random acess memories, including static random access memories.) Therefore, transistors-in-wells gain protection from single events because the well-substrate junction 24 competes for charge from the single event and reduces the amount of charge collected by the vulnerable drain nodes.

Even if, as some evidence suggests, on transistors-in-wells are vulnerable to single events, the circuit data nodes vulnerable to single events are only on one side of the RAM cell since the "off" transistors-in-wells can be designed to prevent collection of critical charge. In p-well designs, this is the side with the "low" voltage. Single event hits on the "high" side either reinforce the logic state (P1 hits) or deliver insufficient charge to upset the cell (N1-in-well hits). In n-well designs, the high voltage side is the only vulnerable side by an analogous argument. In either case, single event vulnerability is associated with a particular nodal voltage, therefore an active device can be used to protect the cell.

Figure 4A:
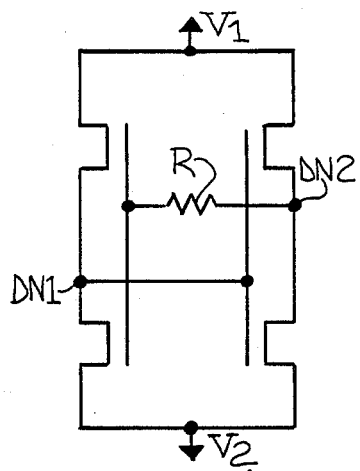
FIGS. 4A and 4B are schematic diagrams of resistor coupled p-well SRAM cells.

The configuration which hardens a SRAM cell with the minimum total added resistance places the resistance between the hit data node and its paired gate. Such a configuration is shown in FIG. 4A. Of course, this approach does not provide single event immunity in operational circuits, because data node DN2 has an equal likelihood of being in "high" and "low" states, and the configuration shown protects the cell only when data node DN2 is the vulnerable node, i.e. when data node DN2 is "low" in p-well CMOS or when data node DN2 is "high" in n-well CMOS. In the case of a hit when data node DN1 is in the vulnerable voltage state, the cell has little more protection than an unhardened cell, such as in FIG. 3. Resistively-hardened SRAM cells add resistance in both gate/drain paths, as diagrammed in FIG. 4B, protecting the cell against hits independent of its logic state. The values of the match resistor pair required for hardening can be specified as a factor a times the value required to harden the cell for one state only, where $0.5 < a < 1.0$ for all SRAMs.

Figure 5A:
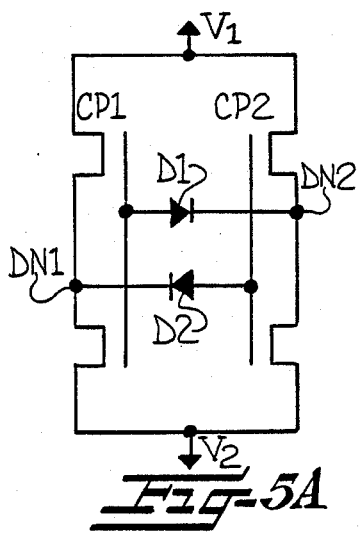
FIGS. 5A–5C and 6A–6C are schematic diagrams of diode coupled p-well and n-well SRAM cells, respectively.
Figure 5B:
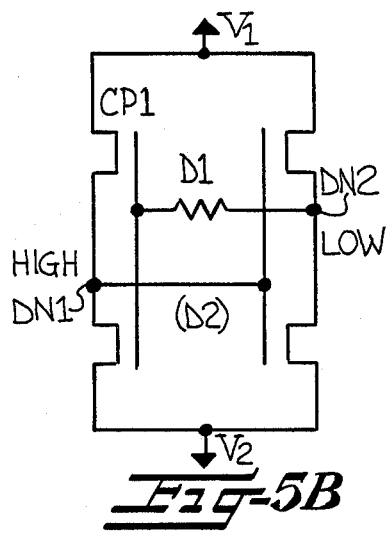
Figure 5C:
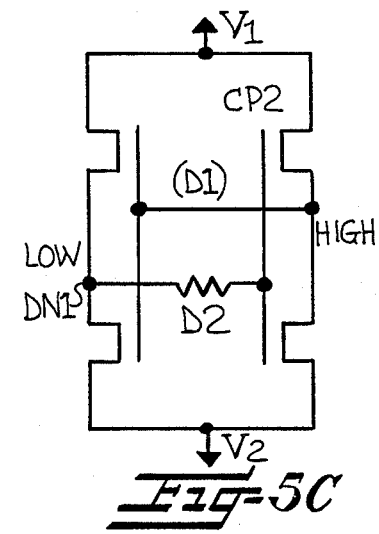
Figure 6A:
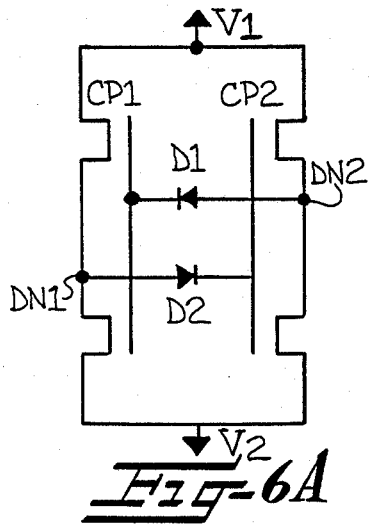
Figure 6B:
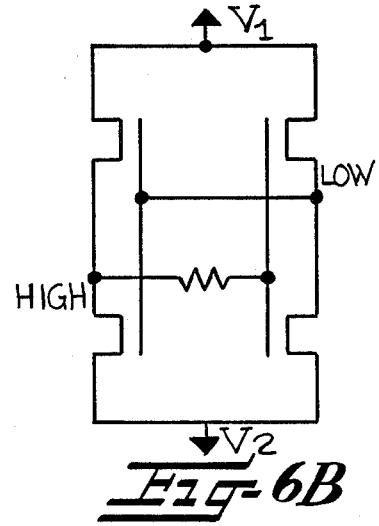
Figure 6C:
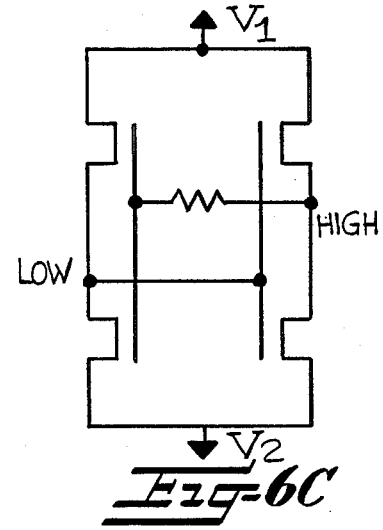

FIGS. 5 and 6 show SRAM cells of the present invention including means for controlling the current flow between each of the data nodes and the corresponding control paths or control electrodes, wherein the means is arranged so as to pass only forward currents out of the control paths to the corrected data node. Cells appropriate to p-well and n-well CMOS technologies respectively are illustrated. The simplest model of the means for controlling the current flow in the above described manner is a diode, which, in its simplest representation is a very high resistance when reverse biased and a very low resistance (or zero resistance) when forward biased. Using these models to illustrate the principle of the novel design, the equivalent RAM cell circuits for single event environments are shown in FIGS. 5B, 5C, and 6B, 6C for the two stable states of each cell. In the case of the p-well (n-well) design of FIG. 5, only the low (high) voltage node is vulnerable, and single event hits onto drains connected thereto tend to raise (lower) that voltage and cause an unwanted change in state. In the present invention such a single event current pulse will reverse-bias the diode on the sensitive side of the circuit (diode D1 in FIG. 5B and diode D2 in FIG. 5C), causing it to present a high resistance and prevent a reverse current from flowing towards control path (control path CP1 in FIG. 5B and control path CP1 in FIG. 5C). By contrast, changing the voltage of the other side of the cell (which is not vulnerable to single events) will forward bias the other diode, so it will present a low (or no) resistance (diode D2 in FIG. 5B and diode D1 in FIG. 5C). The result is that the equivalent circuit of the cell is like that of FIG. 4A, with a high resistance always in series with the node susceptible to upset by single events.

The accessibility of one gate of the cell is an important feature, because it allows data to be written quickly into the cell. The design can be as hard to single events as the resistor-coupled cell, yet it operates faster, because it contains less total equivalent resistance.

Any means for controlling current which presents a large impedance in response to one voltage state of a SRAM and a negligible impedance in response to the other will be effective as a hardening element in SRAMs which have only one side vulnerable to single events for a given stable state. The diode is a simple circuit element with these properties, so it is emphasized in the present preferred embodiment.

Figure 4B:
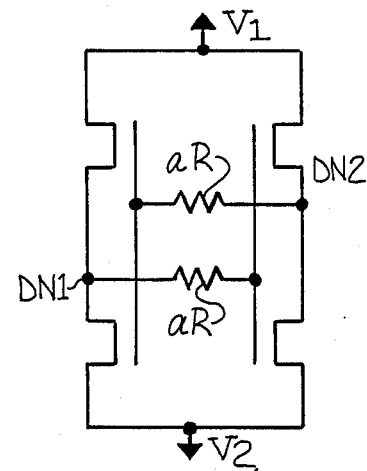

The diode-coupled design has been studied by computer simulation using SPICE-like codes. The diode model used for the feedback element may be more elaborate than that indicated in FIGS. 5 and 6. For instance, it may be a "Schottky-type" diode, schematically represented in FIG. 7A, with the piecewise equivalent of this device shown in FIG. 7B. Rr indicates the large reverse-biased equivalent resistance, Rf the small forward-biased equivalent resistance, and C the junction capacitance and the switching voltage. Although the diode is described as being "Schottky-type", it will be understood that this is merely a term intended to be descriptive of a diode possessing high leakage characteristics, and it is contemplated that the actual device fabricated may differ from conventional Schottky diodes currently in commercial use. Simulations of the RAM cell response to single events and its read-write performance have been based on the Sandia National Laboratories SA3240 RAM cell designs (see also the SA3116 cell which is similar to the SA3240) modified to contain the above diodes in place of feedback resistors. Simulations using the same transistor models have proven accurate in modelling other aspects of the the memory cells. Simulations were performed to determine the value of reverse-biased equivalent required to harden the RAM cell against single events as a function of charge collected and were compared to the resistance value of a comparably hard resistor-coupled SA3240 design. For the same collected charge, the diode-coupled cell, which effectively contains a single resistance, requires a larger resistance than the resistor-coupled cell, which contains two resistors. So far as single events hardening is concerned, the equivalent circuits of FIG. 4A and 4B represent the diode-and resistor-coupled cells, respectively. The factor a is the ratio of the two resistance values corresponding to a given collected charge.

With regard to optimum diode design, just as the resistance of the diode must exceed some minimum value in order to protect the cell from single event current pulses, the diode capacitance must be less than some maximum value. If the capacitance is too large, the fast single event pulses are coupled onto the gate and facilitate logic state reversal. The required relationship between maximum diode resistance (the reverse-bias equivalent resistance) and minimum diode capacitance is depicted in FIG. 8. The component values used in this figure will be design-specific to simulations based on the aforementioned SA3240 cell. Here, a minimum resistance on the order of 200 kilohm is required to protect against maximum collected charge of 4pC, which is believed to be a reasonable maximum amount of charge arising from a single event. For this value of resistance, the diode capacitance should be less than approximately 2.5 fF. While this is a small capacitance, commercially available Schottky diodes of the sizes required for the diode-coupled cell can have capacitances well below this value. An ideal element will contain the minimum allowable values of resistance and capacitance to protect against a worst-case environment. Diode capacitance is discussed more fully in a subsequent section on device fabrication and characterization.

The introduction of an additional circuit element within the RAM cell raises the issue of cell vulnerability to single event hits on the diode. Such hits are not expected to cause logic upset for two reasons. First, there is no voltage drop across the RAM cell coupling element when the cell is in a stable state. For this reason, only the built-in voltage of the diode will deplete the polysilicon, resulting in a small collection volume for charge deposited during a single event. In general, this means that single events will produce only small perturbations if diodes are hit. But even if a significant amount of charge could be collected, upset should not result, because the diode would turn on, limiting the voltage difference across the coupling path. RAM cell designs with symmetric noise margins will be insensitive to such small voltage excursions at gate or data nodes.

The Schottky-type diode is a more complex device than a resistor, and each diode must present more resistance in its reverse bias state than the gate resistance which hardens a resistor-coupled cell. The important advantage of the design is that data can be written faster than the resistor-coupled cell. Write time is defined as the minimum time a signal must be applied to the word lines WL1, WL2 in order to change the cell state. Based upon simulations of the large values of resistance typical of today's "single event hardened" cells, the diode-coupled cell appears to be only slightly less than twice as fast as the resistor-coupled cells.

The feedback diode elements required for this design need to have low forward resistance, low "turn-on" voltage, low capacitance and high reverse resistances—in the hundreds of kilohms range. These characteristics differentiate the elements from many metal-polysilicon Schottky diodes useful for commercial integrated circuits, for the feedback diodes must have more reverse leakage than is acceptable in commercial Schottkys, and hence, the diode suitable for use in the present application is referred to being "Schotty-type".

Correlation of the layout and fabrication of feedback diodes with their device characteristics requires extensive experimental data and work is presently underway to develop these correlations.

The feasibility of obtaining elements with characteristics in the desired ranges can be established using the few published experimental data on polysilicon Schottky diode (as opposed to the standard silicon Schottky). The ideal I-V characteristics of the devices are given by:

$$J = A^* T^2 \exp(-q\phi_b/kT)(qVnkT) - 1)$$

where $A^*$ is the effective Richardson constant. $\phi_b$ and n must be empirically determined and are voltage dependent due to Schottky barrier lowering. For metal-single crystal semiconductor diodes, $\phi_b$ is given by the difference in the equilibrium Fermi levels in the two materials before they are joined, and n=1, but for metal-polysilicon diodes, both $\phi$ and n may be controlled by surface and grain-boundary effects. For small-grained polysilicon at low doping levels, $n \approx 2$ and $\phi \approx \phi_g$, the potential barrier of grain boundaries with respect to the single crystal Fermi level. The value of $\phi_g$ depends on the thickness and composition of grain boundaries, and, indirectly, on the grain size; the value of $\phi_b$ depends on the type of metal and the surface state density of the polysilicon. $\phi_b$ values are upper-bounded by those of metal single crystal silicon junctions, as shown in the Table on page 256 of the book by S. M. Sze, *Physics of Semiconductor Devices,* Second Edition, John Wiley & Sons, Inc., 1981. Note that the variation in these values is large, which will be reflected in turn on voltages of the devices. So far as the forward characteristics of the feedback diode are concerned, a low value of $\phi$ is desirable, as well as a low forward resistance. These features are possible by using large-grained polysilicon. From the foregoing, it will be seen that the present design offers improved write time performance due to the fact that the effective resistance over a wide temperature range can be less than the equivalent resistively hardened cell of the prior art.

The necessary reverse characteristics of the diode, a controlled resistance in the hundreds of kilohms range, may be more challenging to obtain reliably than the forward characteristics, as there are many possible ways of adjusting the reverse characteristics. The reverse current deviates from the ideal I-V charcteristic given above if it is controlled by generation at grain boundaries within the depletion layer. In this case, an approximate form for the reverse current is given by:

$$J = qn_i \frac{W}{t_{eff}} qn_i \frac{W}{\gamma d}$$

where $\gamma$ is a constant determined by the density and capture cross section of trap states at the grain boundaries and d is the average grain size.

Change of logic states is also faster in the design of the present invention. In the diode-coupled cell, the drain and gate connected through the forward-bias diode change voltage quickly, as do the drains connected to the reverse-bias diode. But the gate connected to the reverse-bias diode is shielded by the reverse resistance, and therefore changes voltage more slowly. For this reason, it takes some additional time after the minimum time write cycle is over for the cell to reach its full state. However, in resistor-coupled cells both gates are protected, so this "settle time" is even longer.

The design of the present invention is of even more value since it can be implemented at reasonable costs in terms of circuit area and technology requirements. For n-well designs, a "natural" location for the metal-to-n-polysilicon Schottky-like diode is between the metal p-drain-to-n-drain bridge contact and the gate polysilicon as illustrated in FIG. 9A. It is possible that cell size using this configuration could actually be reduced relative to resistor-coupled cells. The situation is not so convenient for p-well designs. One possible configuration is diagrammed in FIG. 9B. Such an element could increase the cell size relative to resistor-coupled cells.

In the drawings and specification, there has been set forth a preferred embodiment of the invention, and although specific terms are employed they are used in a generic and descriptive sense only and not for the purposes of limitation.

That which is claimed is:

1. A static memory cell exhibiting a high level of immunity to ionizing radiation, such as single event upset errors, while minimizing cell time delay, and comprising:

first and second inverter stages, each of said stages including a pair of driving transistors, a conduction path and a control path, each pair of driving transistors defining a common control node along said control path, the conduction path of each of said inverter stages including a data node, and the control node of each inverter stage being electrically connected to the data node of the other inverter stage, and means for controlling the current flow between each data node and the control node to which it is connected, said means providing low impedance to forward currents traveling from the control node to the data node and high impedance to reverse currents traveling from the data node to the control node, said means providing a high level of immunity to ionizing radiation and minimizing the delay in switching speed due to the high impedance between connected low voltage drains and low voltage gates of the memory cell and due to the low impedance between corresponding components on the high voltage side.

2. A static memory cell according to claim 1, wherein each of said inverter stages comprises a pair of semiconductor devices, one of said devices having an n-type channel and the other of said devices having a p-type channel.

3. A static memory cell according to claim 2 wherein said pair of semiconductor devices are electrically connected to define the conduction path, and the connection between said pair of semiconductor devices defines the data node.

4. A static memory cell according to claim 1 wherein said means for controlling current is a diode.

5. A static memory cell according to claim 1 wherein said means for controlling the current flow has reversed biased leakage characteristics limiting the reverse current flow to an amount proportional to the charge arising from a single event upset error.

6. A static memory cell according to claim 1 wherein said means controlling the current flow is a Schottky-type diode.

7. A static memory cell according to claim 3 wherein said n-type channel semiconductor devices are fabricated in a p-type well wherein said p-type channel devices are fabricated in an n-type substrate, wherein said means for controlling the current flow comprises a diode connected between each data node and the connected control path, said means passing substantially entirely only currents traveling from the control path to the data node to prevent currents traveling in the opposite direction from changing the state of the data node.

8. A static memory cell according to claim 3 wherein said n-type channel semiconductor devices are fabricated in a p-type substrate wherein said p-type channel devices are fabricated in an n-type well, and wherein said means for controlling the current flow comprises a diode connected between each data node and the connected control path, said means passing substantially entirely only currents traveling from the control path to the data node to prevent currents traveling in the opposite direction from changing the state of the data node.

9. A static memory cell exhibiting a high level of immunity to ionizing radiation, such as single event upset errors, while minimizing cell time delay, and comprising:

first and second inverter stages, each of said inverter stages including a pair of semiconductor devices, a conduction path and a control path, each pair of semiconductor defining a common control node along said control path, the conduction path of each said inverter stage including a data node, and the control node of each inverter stage being electrically connected to the data node of the other inverter stage, one of said semiconductor devices having an n-type channel and the other of said devices having a p-type channel, wherein the drains of both the p-type and n-type devices of each inverter stage are connected to the data node of their respective inverter, and the control node of each inverter stage is electrically connected to the data node of the other inverter stage, and means for controlling the current flow between each data node and the control node to which it is connected, said means passing substantially only forward currents traveling from the control node to the data node to prevent reverse currents traveling in the opposite direction from changing the state of the data node.

10. A static memory cell according to claim 9 wherein said means for controlling current is a diode.

11. A static memory cell according to claim 9 wherein said means for controlling current is a Schottky-type diode.

* * * * *